US009755035B2

(12) United States Patent
Zagrebelny et al.

(10) Patent No.: US 9,755,035 B2
(45) Date of Patent: Sep. 5, 2017

(54) PLATINUM-CONTAINING CONSTRUCTIONS

(71) Applicant: Micron Technology, Inc., Boise, ID (US)

(72) Inventors: Andrey V. Zagrebelny, Eagan, MN (US); Chet E. Carter, Boise, ID (US); Andrew D. Carswell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/080,629

(22) Filed: Nov. 14, 2013

(65) Prior Publication Data

US 2014/0070419 A1 Mar. 13, 2014

Related U.S. Application Data

(63) Continuation of application No. 13/234,498, filed on Sep. 16, 2011, now Pat. No. 8,610,280.

(51) Int. Cl.
*H01L 29/45* (2006.01)
*H01L 23/532* (2006.01)
(Continued)

(52) U.S. Cl.
CPC .......... *H01L 29/45* (2013.01); *H01L 21/283* (2013.01); *H01L 21/3212* (2013.01);
(Continued)

(58) Field of Classification Search
CPC .................................................. H01L 21/283
(Continued)

(56) References Cited

U.S. PATENT DOCUMENTS 5,499,207 A * 3/1996 Miki ................. H01L 27/10817
257/295
5,628,663 A * 5/1997 Potter ..................... H01J 3/022
445/49
(Continued)

OTHER PUBLICATIONS

Nanda et al., "Measurement of surface roughness by atomic force microscopy and Rutherford backscattering spectrometry of CdS nanocrystalline films," Applied Surface Science, 133, 1998, pp. 293-297.
(Continued)

*Primary Examiner* — Caridad Everhart
*Assistant Examiner* — Ankush Singal
(74) *Attorney, Agent, or Firm* — Wells St. John P.S.

(57) ABSTRACT

Some embodiments include constructions which have platinum-containing structures. In some embodiments, the constructions may have a planarized surface extending across the platinum-containing structures and across metal oxide. In some embodiments, the constructions may have a planarized surface extending across the platinum-containing structures, across a first material retaining the platinum-containing structures, and across metal oxide liners along sidewalls of the platinum-containing structures and directly between the platinum-containing structures and the first material. Some embodiments include methods of forming platinum-containing structures. In some embodiments, first material is formed across electrically conductive structures, and metal oxide is formed across the first material. Openings are formed to extend through the metal oxide and the first material to the electrically conductive structures. Platinum-containing material is formed within the openings and over the metal oxide. Chemical-mechanical polishing is utilized to form a planarized surface extending across the platinum-containing material and the metal oxide.

5 Claims, 5 Drawing Sheets

(51) Int. Cl.
*H01L 21/283* (2006.01)
*H01L 21/768* (2006.01)
*H01L 21/321* (2006.01)
*H01L 45/00* (2006.01)

(52) U.S. Cl.
CPC .... *H01L 21/7684* (2013.01); *H01L 21/76829* (2013.01); *H01L 21/76831* (2013.01); *H01L 23/53242* (2013.01); *H01L 23/53295* (2013.01); *H01L 45/16* (2013.01); *H01L 2924/0002* (2013.01)

(58) Field of Classification Search
USPC ........................................................ 257/769
See application file for complete search history.

(56) References Cited

U.S. PATENT DOCUMENTS

| | | | |
|---|---|---|---|
| 6,046,403 A | 4/2000 | Yoshikawa et al. | |
| 6,130,102 A | 10/2000 | White et al. | |
| 6,139,696 A | 10/2000 | Arunachalam et al. | |
| 6,284,589 B1* | 9/2001 | Lim et al. | 438/240 |
| 6,326,273 B1* | 12/2001 | Yu | H01L 21/26586 257/E21.205 |
| 6,380,578 B1* | 4/2002 | Kunikiyo | H01L 21/84 257/296 |
| 7,012,335 B2* | 3/2006 | Lee | H01L 21/76807 257/751 |
| 7,179,702 B2 | 2/2007 | Matsuo | |
| 7,288,021 B2 | 10/2007 | de Rege Thesauro et al. | |
| 7,470,623 B2 | 12/2008 | Lee | |
| 7,563,383 B2 | 7/2009 | de Rege Thesauro et al. | |
| 7,569,453 B2* | 8/2009 | Fishburn | H01L 21/76802 257/300 |
| 7,910,914 B2 | 3/2011 | Tanaka et al. | |
| 8,323,580 B2 | 12/2012 | Wang et al. | |
| 2001/0055851 A1* | 12/2001 | Horii | H01L 21/31116 438/393 |
| 2002/0042201 A1* | 4/2002 | Willis | H01L 21/7684 438/692 |
| 2002/0155659 A1 | 10/2002 | Chen et al. | |
| 2004/0092095 A1* | 5/2004 | Nguyen | H01L 21/76829 438/627 |
| 2004/0115890 A1* | 6/2004 | Saito | H01L 29/495 438/303 |
| 2004/0137646 A1 | 7/2004 | Song et al. | |
| 2004/0140494 A1* | 7/2004 | Fishburn | H01L 21/76802 257/296 |
| 2005/0070109 A1* | 3/2005 | Feller | C09G 1/02 438/692 |
| 2005/0145968 A1 | 7/2005 | Goela et al. | |
| 2005/0208754 A1* | 9/2005 | Kostamo | C23C 16/40 438/622 |
| 2006/0113578 A1* | 6/2006 | Chung | H01L 21/7687 257/303 |
| 2006/0211212 A1 | 9/2006 | Baniecki et al. | |
| 2007/0042596 A1 | 2/2007 | McTeer | |
| 2007/0045687 A1* | 3/2007 | Kumura | H01L 27/11502 257/295 |
| 2007/0069381 A1* | 3/2007 | Lu | H01L 21/7682 257/750 |
| 2007/0077721 A1* | 4/2007 | Kanaya | H01L 27/11502 438/396 |
| 2007/0108616 A1* | 5/2007 | Nakagawa | H01L 21/76831 257/751 |
| 2007/0166915 A1 | 7/2007 | Fazan et al. | |
| 2007/0263340 A1 | 11/2007 | Marsh | |
| 2008/0054464 A1* | 3/2008 | Ikeda | H01L 21/76831 257/751 |
| 2008/0224263 A1* | 9/2008 | Tanioku | H01L 28/91 257/532 |
| 2008/0278989 A1* | 11/2008 | Lee | G11C 13/0007 365/148 |
| 2008/0299766 A1* | 12/2008 | Omoto | H01L 21/7682 438/653 |
| 2009/0273882 A1* | 11/2009 | Park | H01G 4/008 361/305 |
| 2010/0038705 A1* | 2/2010 | Doris | H01L 21/28026 257/327 |
| 2010/0301480 A1* | 12/2010 | Choi | H01L 27/228 257/751 |
| 2010/0328565 A1 | 12/2010 | Kubota et al. | |
| 2011/0140209 A1 | 6/2011 | Wang et al. | |
| 2011/0232759 A1* | 9/2011 | Xu | H01G 9/2022 136/261 |
| 2011/0272765 A1* | 11/2011 | Seo | H01L 23/485 257/410 |
| 2012/0025162 A1 | 2/2012 | Shin et al. | |
| 2012/0256150 A1 | 10/2012 | Zagrebelny et al. | |
| 2012/0327626 A1* | 12/2012 | Horiuchi | H01L 23/49822 361/783 |
| 2013/0344669 A1* | 12/2013 | Feng | H01L 29/66545 438/286 |

OTHER PUBLICATIONS

Tong et al., "Characterization of platinum lift-off technique," MESA Research Institute, University of Twente, In: SeSens workshop on Semiconductor Sensor and Actuator Technology, Nov. 30-Dec. 1, 2000, Veldhoven, The Netherlands.

* cited by examiner

PLATINUM-CONTAINING CONSTRUCTIONS

RELATED PATENT DATA

This patent resulted from a continuation of U.S. patent application Ser. No. 13/234,498, which was filed Sep. 16, 2011, and which is hereby incorporated herein by reference.

TECHNICAL FIELD

Platinum-containing constructions, and methods of forming platinum-containing constructions.

BACKGROUND

Platinum may have application for utilization in semiconductor constructions; and, for instance, may have application in integrated circuitry and/or micro-electro-mechanical systems (MEMS).

Platinum is a noble metal, and thus non-reactive relative to numerous materials commonly utilized in semiconductor constructions. Such non-reactivity can be beneficial. For instance, some memory cells utilize oxygen-containing programmable materials between a pair of electrically conductive electrodes (such memory cells may be utilized in, for example, resistive random-access memory [RRAM]). Unfortunately, the programmable materials can problematically react with many of the commonly-available conductive materials. However, the utilization of platinum in the electrodes can alleviate, or even eliminate, problematic reaction with the programmable materials.

Difficulties are encountered in forming platinum-containing structures, in that the non-reactivity of platinum can make the platinum difficult to pattern. It would be desirable to develop new methods for patterning platinum-containing structures, and it would be desirable for such new methods to be suitable for utilization in the fabrication of semiconductor constructions.

DETAILED DESCRIPTION OF THE ILLUSTRATED EMBODIMENTS

In some embodiments, platinum-containing material is formed along metal oxide, and subsequently the platinum-containing material is subjected to chemical-mechanical polishing (CMP). The utilization of the metal oxide may lead to reduced surface roughness across the platinum relative to processes which do not utilize the metal oxide. For instance, the utilization of the metal oxide may enable the chemical-mechanical polished platinum to have a surface roughness of less than 50 Å (as measured as the root mean square roughness by atomic force microscopy), whereas omission of the metal oxide may lead to the chemical-mechanical polished platinum having a surface roughness of at least about 100 Å (as measured as the root mean square roughness by atomic force microscopy). Also, the utilization of the metal oxide may improve retention of the platinum-containing material within openings in a semiconductor construction as compared to processes which do not utilize the metal oxide.

Any suitable metal oxide may be utilized. The term "metal" is used herein to refer to traditional metals, and not to semiconductors (for instance, silicon). In some embodiments, the metal oxide may comprise one or more transition metals; and in some embodiments the metal oxide may comprise, consist essentially of, or consist of one or more of aluminum oxide, hafnium oxide, zirconium oxide and titanium oxide.

Example embodiments are described with reference to FIGS. 1-15.

Figure 1:
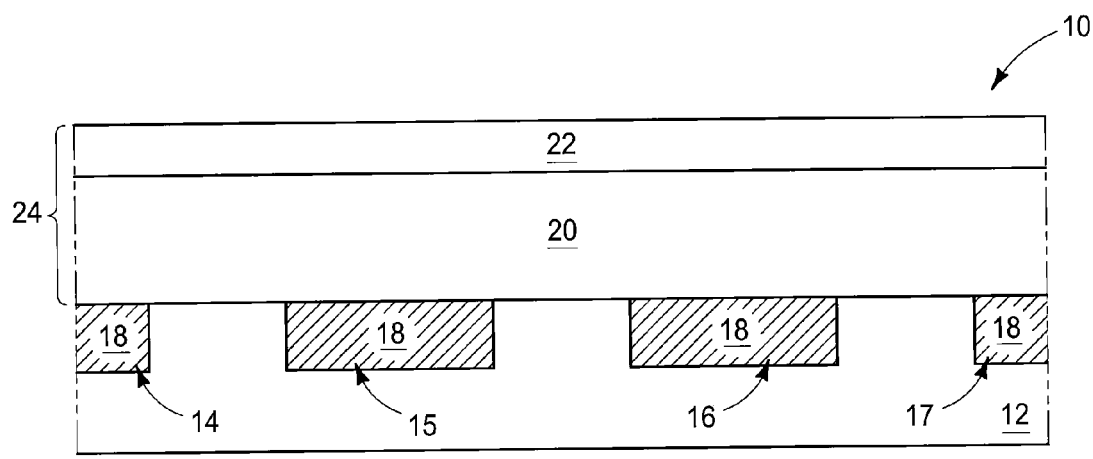
FIGS. 1-4 are diagrammatic, cross-sectional views of a construction illustrating process stages of an example embodiment method.

Referring to FIG. 1, a construction 10 comprises an electrically insulative material 12 supporting a plurality of electrically conductive structures 14-17.

The electrically insulative material 12 may comprise any suitable composition or combination of compositions, and in some embodiments may comprise one or more of silicon nitride, silicon dioxide, and any of various doped glasses (for instance, borophosphosilicate glass, phosphosilicate glass, fluorosilicate glass, etc.). The insulative material 12 may be supported over a semiconductor base (not shown). Such base may comprise, for example, monocrystalline silicon. If the electrically insulative material is supported by a semiconductor base, the combination of the electrically insulative material 12 and the underlying semiconductor base may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, the insulative material 12 may be over a semiconductor construction which comprises a semiconductor base and one or more levels of integrated circuitry. In such embodiments, the levels of integrated circuitry may comprise, for example, one or more of refractory metal materials, barrier materials, diffusion materials, insulator materials, etc.

The electrically conductive structures 14-17 may be lines extending in and out of the page relative to the cross-sectional view of FIG. 1. Such lines may correspond to access/sense lines; and may, for example, correspond to wordlines or bitlines in some embodiments.

The electrically conductive structures 14-17 comprise electrically conductive material 18. Such electrically conductive material may comprise any suitable composition or combination of compositions; and in some embodiments may comprise, consist essentially of, or consist of one or more of various metals (for instance, tungsten, titanium, copper, etc.), metal-containing substances (for instance, metal nitride, metal silicide, metal carbide, etc.) and conductively-doped semiconductor materials (for instance, conductively-doped silicon, conductively-doped germanium, etc.).

A material 20 extends over the conductive structures 14-17, and in some embodiments the material 20 may be referred to as a "first material" to distinguish material 20 from other materials formed subsequently to material 20. The first material 20 may comprise a dielectric material; and in some embodiments may comprise, consist essentially of, or consist of silicon dioxide or silicon nitride.

A metal oxide 22 is formed over the first material 20. The metal oxide may be a dielectric metal oxide, and may comprise any of the metal oxide compositions discussed above (for instance, may comprise, consist essentially of, or consist of one or more of aluminum oxide, hafnium oxide, zirconium oxide and titanium oxide). The metal oxide may be formed utilizing any suitable processing; including, for example, one or more of atomic layer deposition (ALD), physical vapor deposition (PVD) and chemical vapor deposition (CVD). The metal oxide may be less than or equal to about 10 Å thick; and may, for example, have a thickness of from about 5 Å to about 10 Å, Although a single homogeneous first material 20 is between the metal oxide and the conductive structures 14-17 in the shown embodiment, in other embodiments there may be multiple materials between the metal oxide and the conductive structures.

The metal oxide 22 and first material 20 together form a stack 24, and in some embodiments such stack may be referred to as a dielectric stack.

Figure 2:
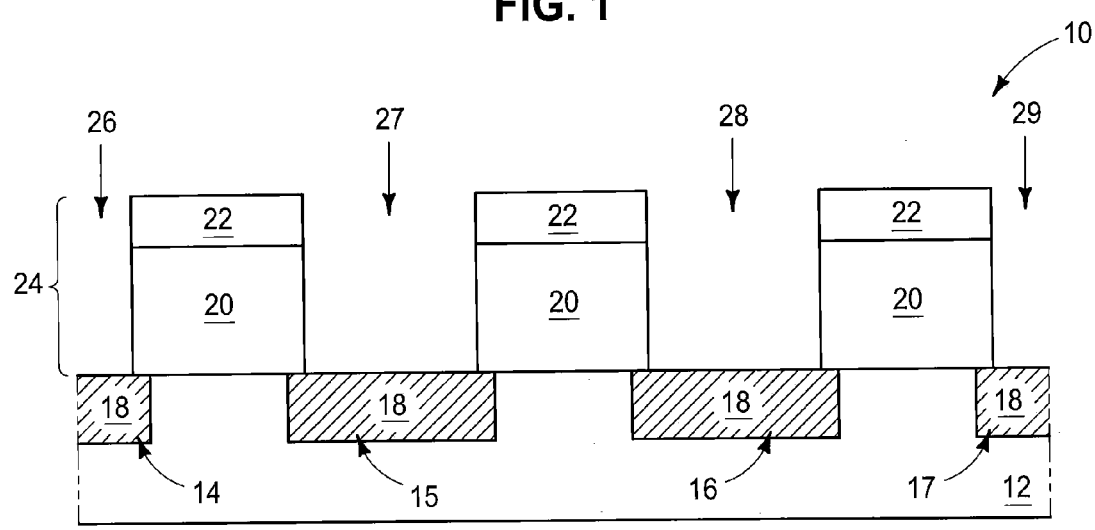

Referring to FIG. 2, openings 26-29 are etched through the dielectric stack 24 and to upper surfaces of the conductive structures 14-17, respectively. The openings are shown to have substantially vertical sidewall surfaces. In other embodiments, the openings may have more tapered sidewall surfaces. The verticality of the sidewall surfaces of the openings may depend upon, among other things, the aspect ratios of the openings, the composition of first material 20, and the chemistry utilized during the etch of such openings.

The openings 26-29 may be formed with any suitable processing. For instance, a mask (not shown) may be formed over the top of stack 24 to define locations of openings 26-29, one or more etches may be utilized to transfer a pattern from the mask through stack 24 to form the openings, and then the mask may be removed to leave the construction shown in FIG. 2. The patterned mask may comprise any suitable composition or combination of compositions, and may, for example, comprise photoresist and/or materials fabricated utilizing pitch-multiplication methodologies.

Figure 3:
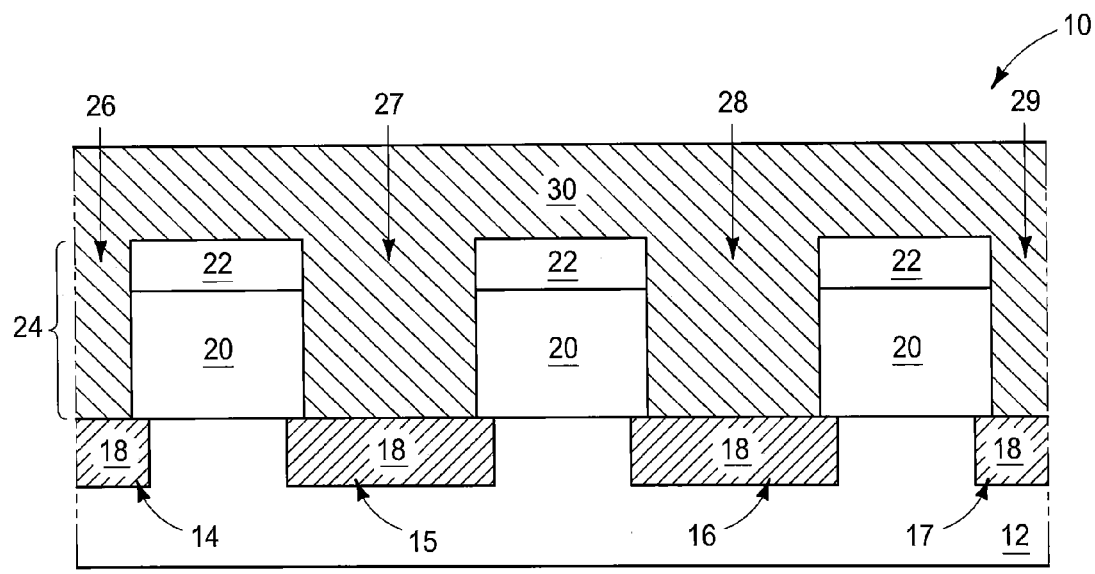

Referring to FIG. 3, platinum-containing material 30 is formed over an upper surface of stack 24, and within the openings 26-29 that extend through the stack. The platinum-containing material may comprise, consist essentially of, or consist of platinum; and may be formed with any suitable processing, including, for example, one or more of ALD, CVD and PVD.

Figure 4:
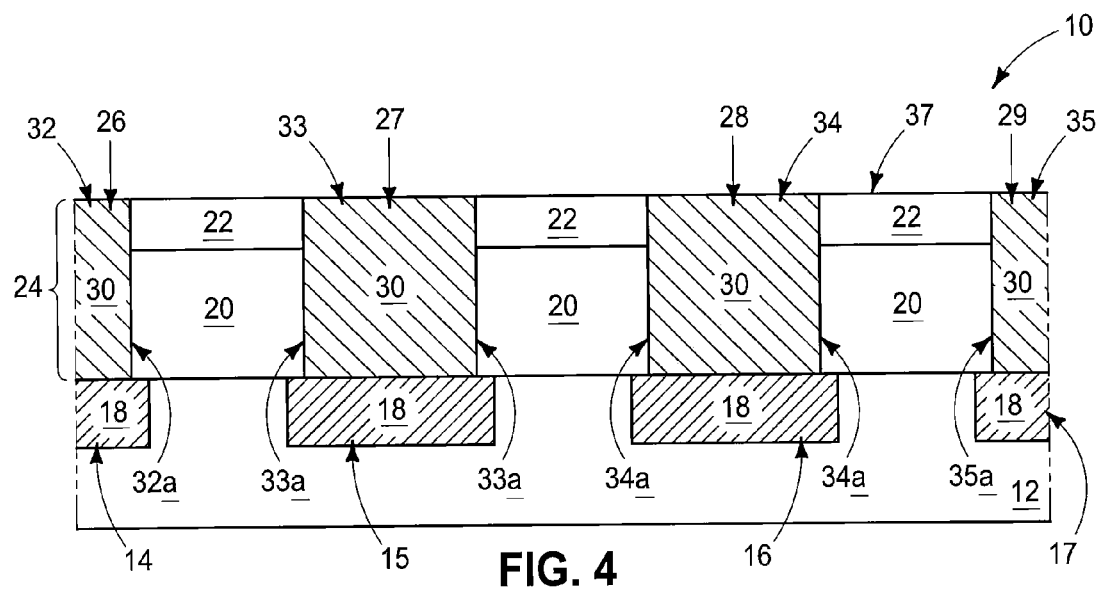

Referring to FIG. 4, construction 10 is subjected to CMP to remove platinum-containing material 30 from over the upper surface of stack 24; and to form platinum-containing structures 32-35 from the platinum-containing material within openings 26-29. In the shown embodiment, the polishing stops on the metal oxide 22.

The polishing forms the shown planarized surface 37 extending across metal oxide 22 and platinum-containing structures 32-35. In some embodiments, the structures 32-35 may ultimately correspond to bottom electrodes of memory cells, and in such embodiments the polishing may be considered to electrically isolate such electrodes from one another.

The polishing may utilize any suitable polishing slurry. For instance, the polishing may utilize a noble metal polishing slurry, such as, for example, a slurry referred to as FCN-120™, and available from Fujimi Corporation of Tualatin, Oreg.

The polishing may be conducted at any suitable temperature, and in some embodiments may be conducted at about room temperature (about 22° C.).

The platinum-containing structures 32-35 have lateral surfaces 32a, 33a, 34a and 35a, respectively, along lateral peripheries of the structures; and such lateral surfaces are directly against metal oxide 22 and first material 20 in the shown embodiment.

The utilization of metal oxide 22 is found to improve the CMP of platinum relative to processes which omit such metal oxide. The improvement in the CMP may include one or both of reduced surface roughness across the resulting platinum-containing structures 32-35 relative to prior art processes, and less pull-out of platinum from within openings 26-29 relative to prior art processes.

A possible mechanism by which the metal oxide leads to improved surface roughness across the platinum-containing structures is that the metal oxide has appropriate adhesion relative to platinum to enable micro-peeling of platinum from the metal oxide during CMP. The micro-peeling leads to substantially continuous, uniform removal of platinum from over the metal oxide; in contrast to prior art processes lacking such metal oxide, in which platinum sometimes peels in large sheets.

A possible mechanism by which the metal oxide leads to less pull-out of platinum from within openings 26-29 is that the metal oxide has appropriate adhesion relative to platinum so that the metal oxide on lateral surfaces 32a, 33a, 34a and 35a assists in retaining the platinum-containing structures 32-35 within the openings. Additionally, or alternatively, the metal oxide may alleviate the prior art problem of having platinum peel in large sheets during CMP. It is possible that some of the prior art problem with platinum structures pulling out from openings is due to the platinum peeling in large sheets during CMP, with platinum being pulled out of the openings and transferring with the large platinum sheets that are removed during prior art platinum CMP processes.

The above-discussed mechanisms are provided to assist the reader in understanding some aspects of the invention, and are not to limit the claims that follow except to the extent, if any, that such mechanisms are explicitly recited in the claims.

In some embodiments, it is found that utilizing a metal oxide 22 consisting of aluminum oxide may be particularly advantageous for achieving platinum CMP in which the resulting platinum-containing structures have low surface roughness, and in which few, if any, platinum-containing structures are undesirably pulled out from within the openings utilized to pattern such structures.

The planarized surface 37 may have a root mean square roughness across the platinum of less than or equal to about 50 Å. Such low amount of surface roughness may be advantageous relative to prior art platinum surfaces having a higher amount of surface roughness. For instance, the platinum surface having the low amount of surface roughness may provide a better pad for deposition of subsequent materials than would a platinum surface having a higher amount of surface roughness. In some embodiments, the platinum-containing structures 32-35 are electrodes, and programmable material (not shown) is subsequently formed along the upper surfaces of the platinum-containing structures. In such embodiments, it may be advantageous to form the programmable material along a platinum-containing surface having a low amount of surface roughness relative to a platinum-containing surface having a higher amount of surface roughness.

The platinum-containing structures 32-35 are contained within the openings 26-29, and thus have shapes defined by the shapes of the openings. The openings 26-29 may have any suitable shapes to define desired platinum-containing structures. In some example embodiments, the openings may be trenches utilized to define platinum-containing lines that extend horizontally into and out of the page relative to the cross-section of FIG. 4, in other example embodiments the openings may be shaped to define vertically-extending platinum-containing interconnects relative to the cross-section of FIG. 4, etc. The openings 26-29 may have substantially the same shapes as one another in some embodiments; and in other embodiments at least one of the openings may have a substantially different shape than at least one other of the openings.

In the shown embodiment, the openings extend to electrically conductive structures 14-17. In other example embodiments the openings may not extend to such electrically conductive structures. For instance, in some embodiments the openings may be long trenches utilized to define platinum-containing lines. Such trenches may be entirely contained within the first material 20, rather than extending through such first material to electrically conductive structures (although there may be regions along the trenches where the trenches contact electrically conductive structures to form interconnects between the platinum-containing lines and other circuitry).

Figure 5:
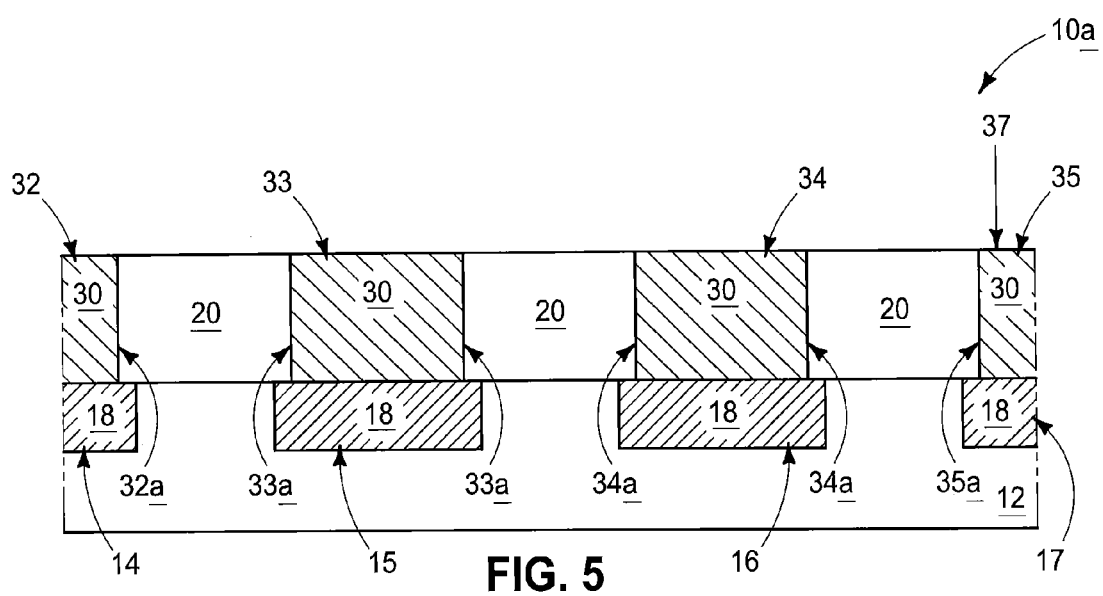
FIG. 5 is a diagrammatic, cross-sectional view of the construction of FIG. 1 shown at a process stage subsequent to that of FIG. 3, and alternative to that of FIG. 4.

FIG. 5 shows a construction 10a illustrating an embodiment alternative to that of FIG. 4. Specifically, the CMP has been conducted for a sufficient duration to entirely remove metal oxide 22 (FIG. 4), and to thus form the planarized surface 37 extending across platinum-containing structures 32-35 and first material 20. Accordingly, the lateral surfaces 32a, 33a, 34a and 35a of platinum-containing structures 32-35 are only against first material 20 in the embodiment of FIG. 5; rather than being against the first material 20 and the metal oxide 22 as occurred in the embodiment of FIG. 4.

Another example embodiment is described with reference to FIGS. 6-11.

Figure 6:
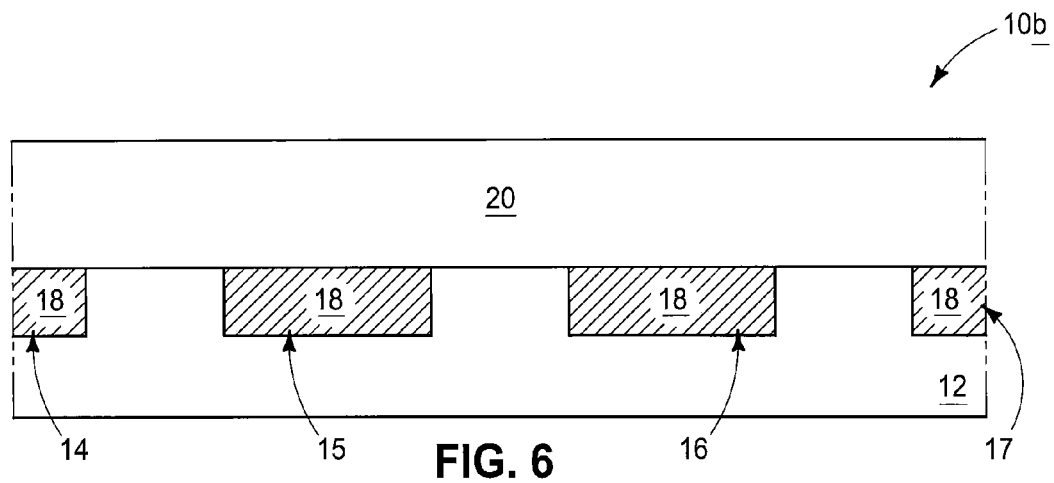
FIGS. 6-11 are diagrammatic, cross-sectional views of a construction illustrating process stages of another example embodiment method.

Referring to FIG. 6, a construction 10b comprises the first material 20 over the electrically conductive structures 14-17.

Figure 7:
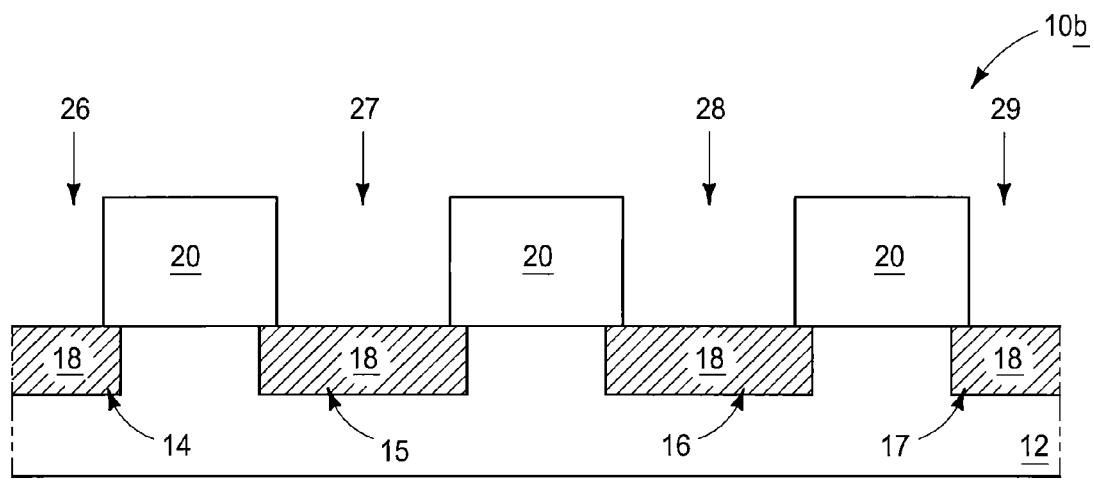

Referring to FIG. 7, openings 26-29 are etched through first material 20 to the underlying electrically conductive structures 14-17.

Figure 8:
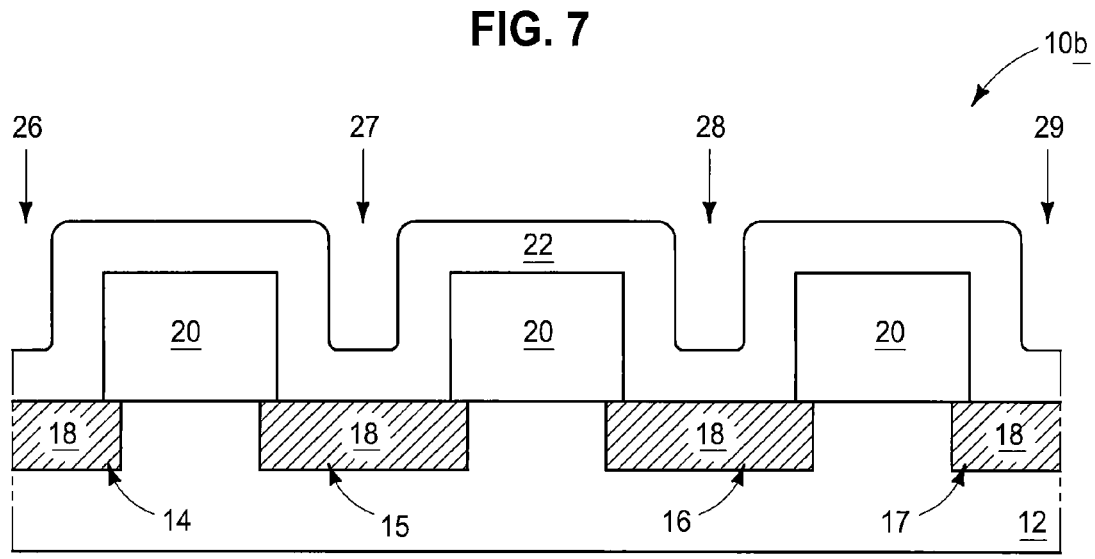

Referring to FIG. 8, metal oxide 22 is formed across material 20 and within openings 26-29. The metal oxide lines sidewalls and bottoms of the openings 26-29, and narrows such openings.

Figure 9:
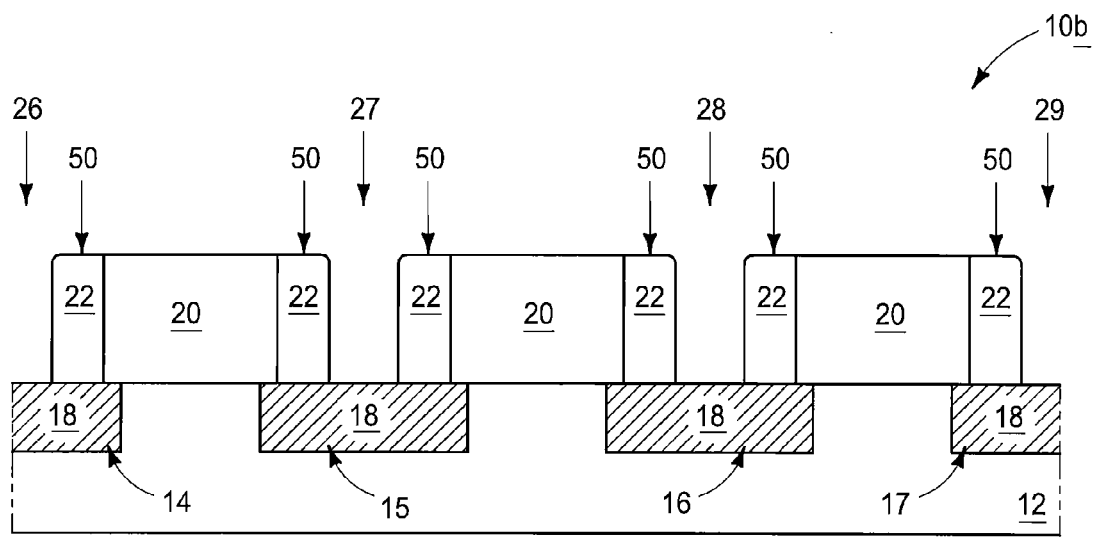

Referring to FIG. 9, the metal oxide 22 is subjected to anisotropic etching which removes the metal oxide from over substantially horizontal surfaces (specifically, from along the bottoms of openings 26-29, and from over the top of first material 20), while leaving the metal oxide along the substantially vertical surfaces (specifically, along the sidewalls of the openings). The segments of metal oxide 22 remaining at the processing stage of FIG. 9 form a plurality of liners 50 along sidewall peripheries of the openings 26-29.

Figure 10:
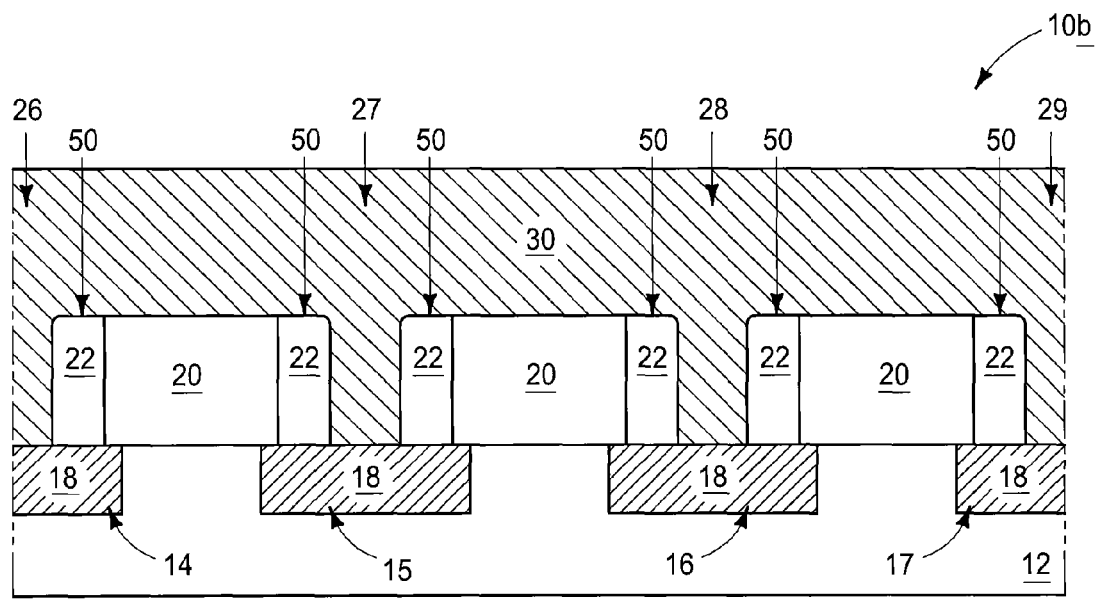

Referring to FIG. 10, platinum-containing material 30 is formed within openings 26-29, and directly against the liners 50 of metal oxide 22.

Figure 11:
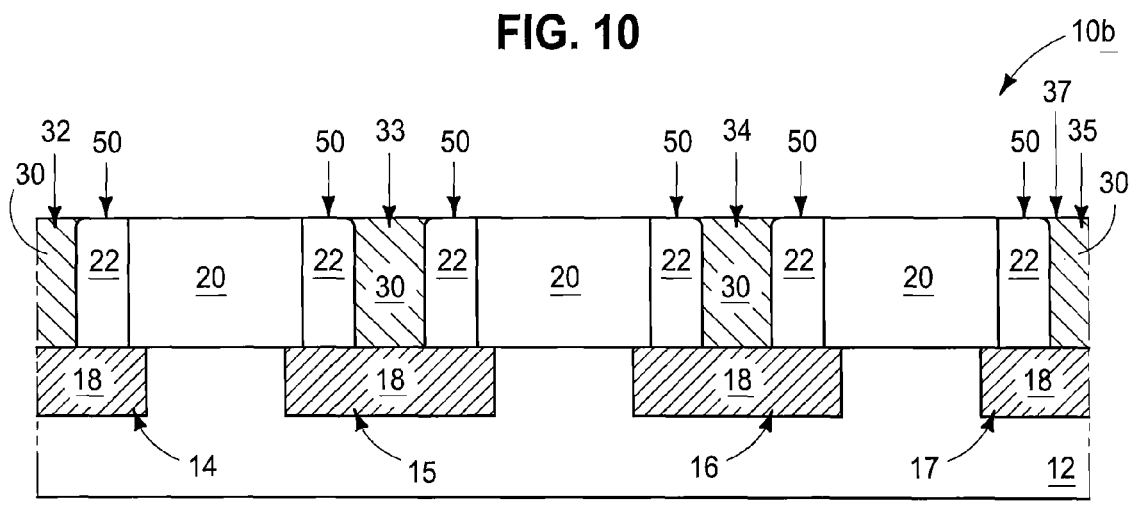

Referring to FIG. 11, construction 10b is subjected to CMP to form platinum-containing structures 32-35. The polishing forms the planarized surface 37 extending across first material 20, liners 50, and platinum-containing structures 32-35. In the embodiment of FIG. 11, the liners 50 are directly between the first material 20 and sidewall surfaces of the platinum-containing structures; and are directly against the first material 20 and the sidewall surfaces of the platinum-containing structures.

Another example embodiment is described with reference to FIGS. 12-14.

Figure 12:
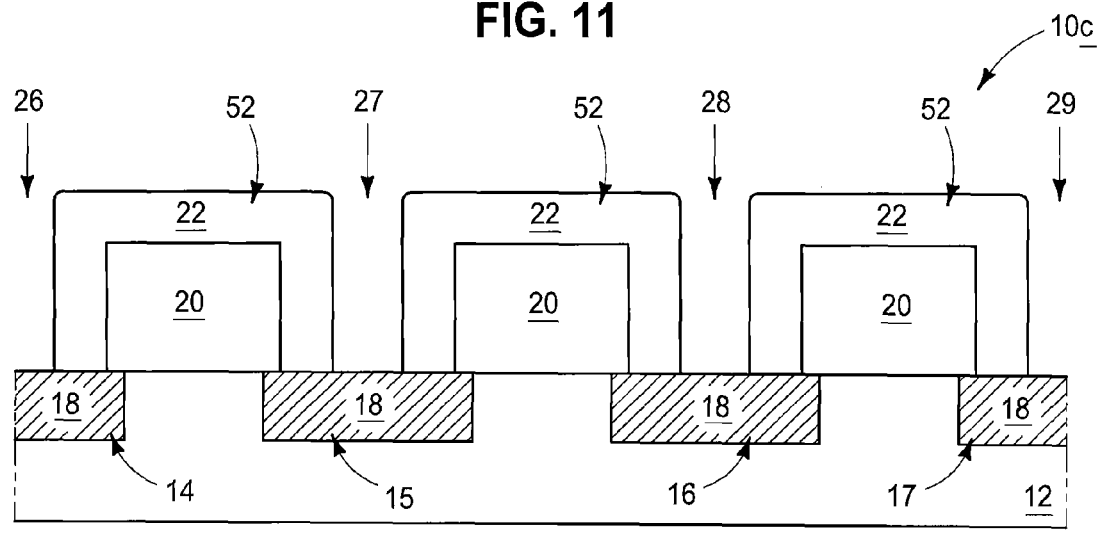
FIGS. 12-14 are diagrammatic, cross-sectional views of a construction illustrating process stages of another example embodiment method. The process stage of FIG. 12 may follow that of FIG. 7 in some embodiments.

Referring to FIG. 12, a construction 10c is shown at a processing stage subsequent to that of FIG. 7. The construction 10c comprises metal oxide 22 formed over first material 20 and within the openings 26-29. The metal oxide lines sidewalls of the openings 26-29, and narrows such openings. Unlike the above-discussed embodiment of FIG. 8, the metal oxide lines sidewall peripheries of openings 26-29 but is not along the bottom peripheries of such openings. Metal oxide 22 may be formed to line the sidewall peripheries of the openings and not cover the bottom peripheries of the openings utilizing appropriate deposition conditions and/or high aspect ratio openings; as will be recognized by persons of ordinary skill in the art. Alternatively, the construction of FIG. 12 may be formed by forming the metal oxide to initially line the bottom peripheries of the openings in addition to lining the sidewall peripheries of the openings, and the metal oxide may then be selectively removed from the bottom peripheries of the openings utilizing appropriate etching and patterning; as will be recognized by persons of ordinary skill in the art.

The metal oxide 22 may be considered to form an expanse 52 across an upper surface of first material 20; and specifically across regions of the first material between the openings 26-29.

Figure 13:
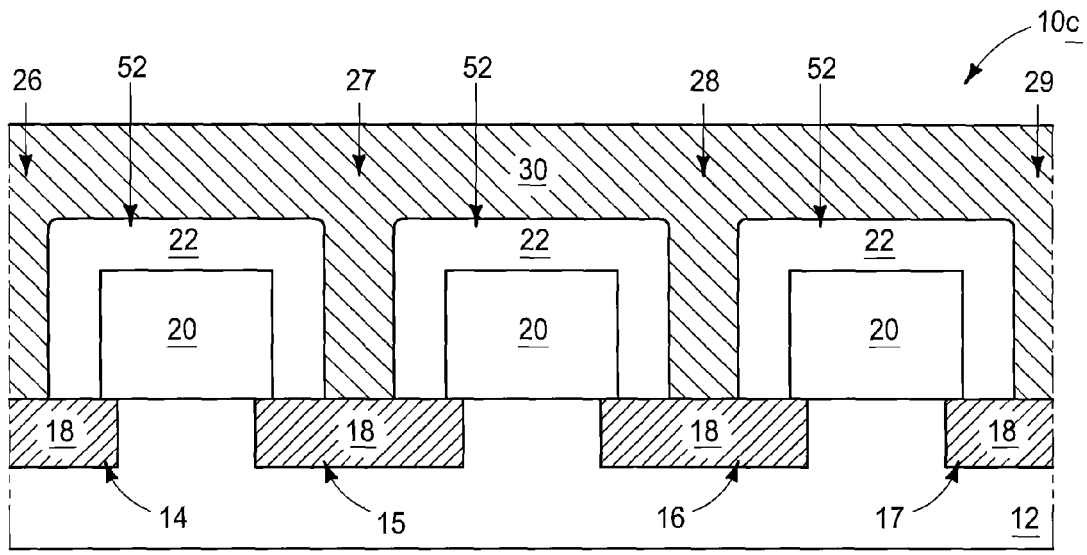

Referring to FIG. 13, platinum-containing material 30 is formed across dielectric material 22 and within openings 26-29.

Figure 14:
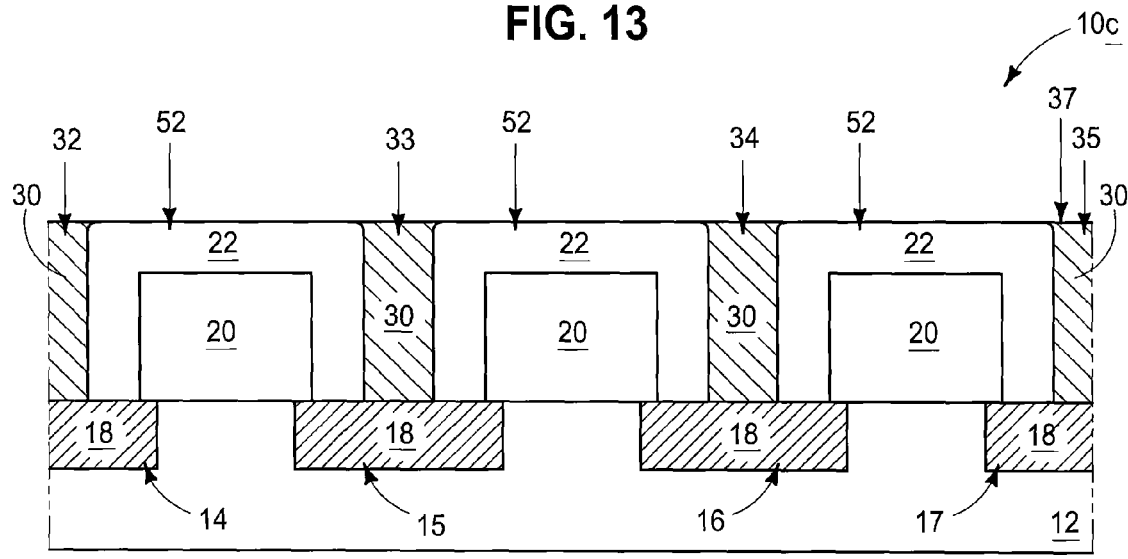

Referring to FIG. 14, construction 10c is subjected to CMP to form platinum-containing structures 32-35. The polishing forms the planarized surface 37 extending across metal oxide expanse 52, and across the platinum-containing structures 32-35.

Figure 15:
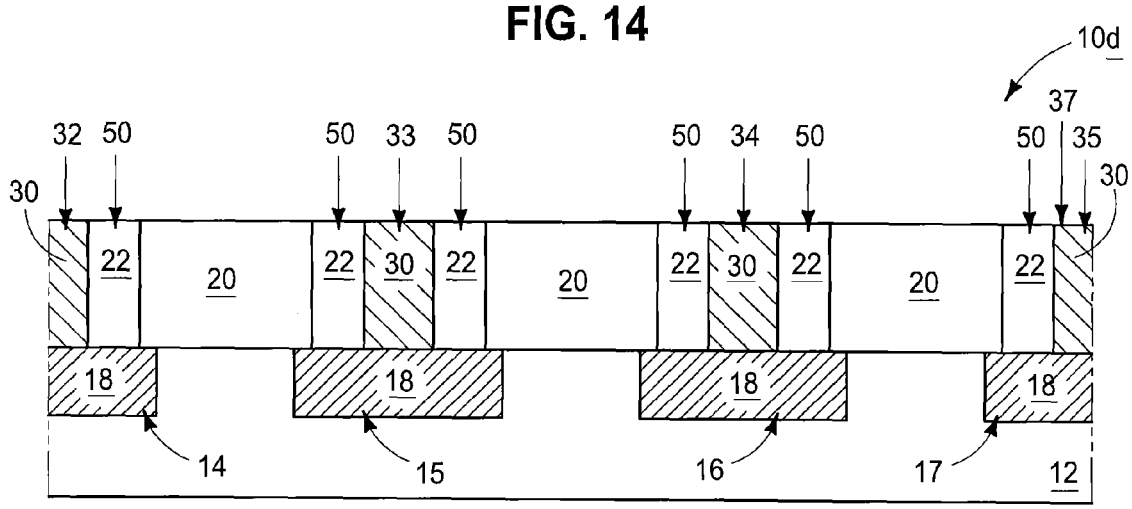
FIG. 15 is a diagrammatic, cross-sectional view of the construction of FIG. 12 shown at a process stage subsequent to that of FIG. 13, and alternative to that of FIG. 14.

FIG. 15 shows a construction 10d illustrating an embodiment alternative to that of FIG. 14. Specifically, the CMP has been conducted for a sufficient duration to entirely remove metal oxide 22 from over first material 20, and to thus form liners 50 from the metal oxide 22. The planarized surface 37 formed by the CMP extends across platinum-containing structures 32-35, liners 50 and first material 20.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, a construction comprises a dielectric stack having metal oxide over a first material. Platinum-containing structures extending into the dielectric stack, with the platinum-containing structures having sidewall surfaces along the metal oxide and along the first material. A planarized surface extends across the platinum-containing structures and the metal oxide.

In some embodiments, a construction comprises a first material, platinum-containing structures extending into the first material, and metal oxide liners along sidewall surfaces of the platinum-containing structures and directly between said sidewall surfaces and the first material. A planarized surface extends across the platinum-containing structures, the first material and the metal oxide liners.

In some embodiments, a method of forming a plurality of platinum-containing structures comprises forming a first material across a plurality of electrically conductive structures, and forming metal oxide across the first material. Openings are formed to extend through the metal oxide and the first material to the electrically conductive structures. Platinum-containing material is formed within the openings and over the metal oxide. Chemical-mechanical polishing is utilized to form a planarized surface extending across the platinum-containing material and the metal oxide.

In some embodiments, a method of forming a plurality of platinum-containing structures comprises forming a first material across a plurality of electrically conductive structures, and forming metal oxide across the first material. Openings are formed to extend through the metal oxide and the first material to the electrically conductive structures. Platinum-containing material is formed within the openings and over the metal oxide. Chemical-mechanical polishing is utilized to remove the metal oxide and form a planarized surface extending across the platinum-containing material and the first material.

In some embodiments, a method of forming a plurality of platinum-containing structures comprises forming a first material across a plurality of electrically conductive structures. Openings are formed to extend through the first material to the electrically conductive structures. Metal oxide is formed across the first material and within the openings. The metal oxide within the openings lines sidewalls and bottoms of the openings. The metal oxide is etched to remove the metal oxide from over the first material and from across the bottoms of the openings while leaving liners of the metal oxide along the sidewalls of the openings. Platinum-containing material is formed within the openings and directly against the metal oxide liners. Chemical-mechanical polishing is utilized to form a planarized surface extending across the platinum-containing material, the first material and the metal oxide liners.

In some embodiments, a method of forming a plurality of platinum-containing structures comprises forming a first material across a plurality of electrically conductive structures. Openings are formed to extend through the first material to the electrically conductive structures. Metal oxide is formed across the first material and within the openings. The metal oxide lines sidewalls of the openings to narrow the openings, and the metal oxide forms an expanse across regions of the first material between the openings. Platinum-containing material is formed within the narrowed openings and over the metal oxide. Chemical-mechanical polishing is utilized to form a planarized surface extending across the platinum-containing material and across the metal oxide expanse.

In some embodiments, a method of forming a plurality of platinum-containing structures comprises forming a first material across a plurality of electrically conductive structures. Openings are formed to extend through the first material to the electrically conductive structures. Metal oxide is formed across the first material and within the openings. The metal oxide lines sidewalls of the openings to narrow the openings, and the metal oxide forms an expanse across regions of the first material between the openings. Platinum-containing material is formed within the openings and directly over the metal oxide expanse. Chemical-mechanical polishing is utilized to remove the metal oxide expanse and form a planarized surface extending across the platinum-containing material, the first material and segments of the metal oxide lining sidewalls of the openings.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. A construction, comprising:
a dielectric material supported by a semiconductor substrate;
a first opening within the dielectric material;
a second opening within the dielectric material, the second opening being separated from the first opening by a single block consisting of the dielectric material, the single block of the dielectric material having a first sidewall of the dielectric material within the first opening and a second sidewall of the dielectric material within the second opening, the single block of the dielectric material having an upper surface consisting of the dielectric material and extending an entirety of a distance between the first and second sidewalls;
metal oxide liners lining the first and second openings, the metal oxide liners being in direct contact with the first sidewall of the dielectric material within the first opening and in direct contact with the second sidewall of the dielectric material within the second opening;
platinum within the first and second openings, the platinum being in direct contact with the metal oxide liners, the platinum and the metal oxide liners entirely filling the first and second openings; and
a planarized surface extending across the platinum, the dielectric material and the metal oxide liners.

2. The construction of claim 1 wherein metal oxide of the metal oxide liners comprises one or more transition metals.

3. The construction of claim 1 wherein the metal oxide comprises one or more of aluminum oxide, hafnium oxide, zirconium oxide and titanium oxide.

4. The construction of claim 1 wherein the metal oxide consists of aluminum oxide.

5. The construction of claim 1 wherein the dielectric material comprises silicon dioxide.

* * * * *

UNITED STATES PATENT AND TRADEMARK OFFICE
CERTIFICATE OF CORRECTION

PATENT NO. : 9,755,035 B2
APPLICATION NO. : 14/080629
DATED : September 5, 2017
INVENTOR(S) : Andrey V. Zagrebelny, Chet E. Carter and Andrew D. Carswell Page 1 of 1

It is certified that error appears in the above-identified patent and that said Letters Patent is hereby corrected as shown below:

In the Claims

Column 8, Line 63 Claim 3 – Replace "wherein the metal" with --wherein metal--

Column 8, Line 66 Claim 4 – Replace "wherein the metal" with --wherein metal--

Column 9, Line 1 Claim 5 – Replace "wherein the dielectric" with --wherein dielectric--

Signed and Sealed this
Thirty-first Day of October, 2017

Joseph Matal
*Performing the Functions and Duties of the
Under Secretary of Commerce for Intellectual Property and
Director of the United States Patent and Trademark Office*